(12) United States Patent
Wesselink et al.

(10) Patent No.: US 10,369,826 B2
(45) Date of Patent: Aug. 6, 2019

(54) SECURITY DOCUMENT AND METHOD OF MANUFACTURING

(71) Applicant: MORPHO B.V., Haarlem (NL)

(72) Inventors: Wilhelmus Johannes Wesselink, Haarlem (NL); Jan Van Den Berg, Gouda (NL)

(*) Notice: Subject to any disclaimer, the term of this patent is extended or adjusted under 35 U.S.C. 154(b) by 0 days.

(21) Appl. No.: 15/568,003

(22) PCT Filed: Apr. 20, 2016

(86) PCT No.: PCT/NL2016/050277
§ 371 (c)(1),
(2) Date: Oct. 20, 2017

(87) PCT Pub. No.: WO2016/171552
PCT Pub. Date: Oct. 27, 2016

(65) Prior Publication Data
US 2018/0141362 A1 May 24, 2018

(30) Foreign Application Priority Data
Apr. 22, 2015 (NL) .................................. 2014690

(51) Int. Cl.
*B41M 3/14* (2006.01)
*G03F 7/00* (2006.01)
(Continued)

(52) U.S. Cl.
CPC .............. *B41M 3/14* (2013.01); *B41M 5/24* (2013.01); *B42D 25/23* (2014.10); *B42D 25/309* (2014.10);
(Continued)

(58) Field of Classification Search
CPC ......... B41M 3/14; B41M 5/24; G03F 7/0002; B42D 25/23; B42D 25/309; B42D 25/342;
(Continued)

(56) References Cited

U.S. PATENT DOCUMENTS

2015/0146297 A1* 5/2015 Commander .......... B42D 25/30
359/627

FOREIGN PATENT DOCUMENTS

DE     10 2007 025667 A1    12/2008
EA         201790198 A1     5/2017
(Continued)

OTHER PUBLICATIONS

International Search Report, dated Aug. 11, 2016, from corresponding PCT/NL2016/050277 application.

*Primary Examiner* — Justin V Lewis
(74) *Attorney, Agent, or Firm* — Young & Thompson

(57) ABSTRACT

Disclosed is a security document including an image area, a repeating image pattern in the image area of mutually spaced image elements at a mutual distance D and a layer of a plastics material overlying the image area and an array of lenses in the plastics material. The lenses are spaced at a mutual distance L which may be equal to D or which may differ from D, the array of lenses overlying only a part of the image area surface and are formed in the plastics material within an image contour. Within the contour an image may be observed such as a Moiré magnification or a Moiré effect of light and dark stripes. The lenses may be formed for instance by laser ablation or by imprinting.

20 Claims, 3 Drawing Sheets

(51) Int. Cl.
*B42D 25/23* (2014.01)
*B42D 25/309* (2014.01)
*B42D 25/342* (2014.01)
*B42D 25/41* (2014.01)
*B42D 25/324* (2014.01)
*B42D 25/435* (2014.01)
*B42D 25/36* (2014.01)
*B41M 5/24* (2006.01)
*G02B 3/00* (2006.01)

(52) U.S. Cl.
CPC ......... *B42D 25/324* (2014.10); *B42D 25/342* (2014.10); *B42D 25/36* (2014.10); *B42D 25/41* (2014.10); *B42D 25/435* (2014.10); *G02B 3/0031* (2013.01); *G03F 7/0002* (2013.01)

(58) Field of Classification Search
CPC .... B42D 25/36; B42D 25/435; B42D 25/324; B42D 25/41; G02B 3/0031
USPC ....... 283/67, 70, 72, 74, 75, 77, 94, 98, 901
See application file for complete search history.

(56) References Cited

FOREIGN PATENT DOCUMENTS

| | | |
|---|---|---|
| EP | 1 874 557 B1 | 1/2008 |
| EP | 1 894 169 B1 | 3/2008 |
| WO | 2009/078881 A1 | 6/2009 |
| WO | 2013/167887 A1 | 11/2013 |
| WO | WO-2013167887 A1 * | 11/2013 ............. B42D 25/30 |

* cited by examiner

SECURITY DOCUMENT AND METHOD OF MANUFACTURING

FIELD OF THE INVENTION

The invention relates to a security document comprising a portrait image (2) of a holder and an image area, an image pattern in the image area of mutually spaced image elements at a mutual distance D, a layer of a plastics material overlying the image area and an array of lenses in the layer of plastics material.

The invention also relates to a method of manufacturing such a security document.

BACKGROUND OF THE INVENTION

From EP1874557 in the name of the applicant, a security document is known with a portrait image in the form of a number of interlaced line images. Groups of image lines are provided each time below a cylindrical lens by laser engraving in a polycarbonate base layer. Viewing the image results in a stereoscopic view of the security document holder. The image area in which the interlaced lines are formed by laser engraving and are covered by the lenses, which may be formed in the polycarbonate material by embossing, is rectangular.

From PCT/NL2014/050846, in the name of the applicant, a security document is known in which the lenses are formed by an array of spherical lenses in the image area, the image area comprising an array of image elements having a pitch that is different from the pitch of the lenses, resulting in an Moiré magnification of the image which is viewed below or above the image elements in the plastics material.

WO 2013/167887 discloses a security document provided with a pattern of lenses that are applied within a contour of letters D, L or R and a pattern of micro-images situated below the lenses.

The known security documents are difficult to illegally duplicate in view of the high precision process required for properly aligning the image formed in the image area with the lens structure. Alteration of a primary image of a known security document is detectable in view of difficult access to the image pattern in the image area below the lenses of the authentication image. The known security documents have as a disadvantage that the primary image, which gives information about the document holder, needs to be applied at the site of production of the security document. In case of an identity document, the primary image is often formed by a portrait image of the holder of the document. This means that completion of the security document such as by application of the authentication image or personalization data, requires the holder image to be forwarded to the production site of the document which may involve complex logistics.

It is therefore an object of the present invention to provide a security device such as a card or document having improved security features. It is a further object of the invention to provide a security device which may be produced and completed at one location and may be authenticated and/or personalized in an easy and secure manner at a location remote from the production site.

SUMMARY OF THE INVENTION

Hereto the security document according to the invention is characterized in that the lenses are spaced at a mutual distance L which differs from D, the array of lenses overlying only a part of the image area surface and being formed in the plastics material within an image contour which contour forms indicia displaying information pertaining to the holder and/or an issuing authority of the document.

The image pattern below the plastics material can consist of a pattern of parallel lines or can be formed by a regular two-dimensional array of repeating image elements such as dots, geometrical shapes or micro images, such as micro portraits. This pattern forms a regular structure with no distinctive characteristics for the observer. At the site of completion of the security document, which may be a town hall or other place of issue, the document may be placed in a processing station for interacting with the plastics material and for forming therein an array of lenses above the image pattern, the array of lenses for instance being situated within a contour of Alfa-numerical characters, geometrical shapes or other images. The contour can form indicia that pertain to the user, such as date and/or place of birth, length, eye color or other information. The contour can also form indicia relating to the issuing authority that provides the security document such as issue date or expiration date of the identity document, serial number, or other authentication indicia. The issuing authority may be a government department, a company or a security organization.

Only below the lenses that are formed in the plastics material, the image pattern becomes visible to the user in a way that is distinct from that part of the image pattern that is not covered by any lenses and results in for instance a Moiré magnified image situated below or above the plane of the plastics material, or in a Moiré interference pattern. The image pattern does not need to be accurately aligned with the lens array that is formed, as the optical effect of the lenses on the image pattern depends only on the difference between the spacing of the repeating image elements D and the spacing of the lenses L, such that initial positioning of the document in the processing station is not critical for producing a sharply defined visible image and a large freedom in the types of underlying image patterns achieved.

For a constant image pattern, different contours of lenses may be applied to personalize and/or authenticate the security document.

The security document may comprise a plastics or laminated card or may be part of a booklet such as a passport, and the like.

The image pattern may be printed onto a paper or plastics layer below the plastics material in an ink pattern or may be provided by laser engraving in the plastics material layer or in a layer below the plastics material layers, or combinations thereof.

The lenses may be formed in the plastics material by laser ablation of the plastics material. Laser ablation has as an advantage that the lens pattern can be given a unique shape for each security document by determining the specific shape of the contour. The laser controller can for instance be programmed with data pertaining to a holder of the security device such as name, date of birth and the like, or can provide the lens pattern within a contour that represents a date of issue or expiry.

In case the lenses are formed by laser ablation, it is in an embodiment possible for the distance L between the lenses to be equal to the distance D between the image elements. The image elements may in that case be formed by pixel tracks of interlaced pictures. Each group of lines is situated below a respective lenticular lens such that multiple images are rendered visible below the lenticular lenses, depending on the viewing angle, such as described in EP1 874 557. Because the contour of the lens elements can be shaped by the laser in accordance to data pertaining to a holder of the security device, an improved security feature is provided by the combination of the contour and the image rendered visible below the lens elements.

In an alternative embodiment, the lenses are formed by imprinting. Imprinting is carried out by applying as a plastics top layer a UV curing material such as a resin in the soft or liquid state and contacting it with an patterned imprint member, that is transparent and flexible to imprint the lens pattern into the softened or liquid resin. The resin in than hardened by transmission of optical radiation (such as UV) through the transparent imprint member while it is contacting the resin layer, the imprint member being removed from the protective layer after hardening of the resin layer. By maintaining the flexible and transparent imprint member into contact with the soft or liquid resin layer and curing the resin layer by irradiating optical radiation onto the resin layer through the imprint member, the resin layer can be hardened to a sufficient degree such that removal of the flexible imprint member leaves well-defined small-scale structures. This allows an accurately defined lens pattern to be formed with accurately defined dimensions smaller than 100 μm, in the contoured image area. Through the lens pattern a Moiré magnification or interference pattern security feature can be viewed.

The flexible imprint member can be applied at a site that is remote from the site at which the security device is manufactured with general security features, so that a personalization or authentication step can be carried out, including providing an authentication image (e.g. a mini portrait) of a holder into the security device below the imprinted lens system.

It is noted that Substrate Conformal Imprint Lithography (SCIL) is a known technology to provide large area patterning on Silicon substrates using a soft composite working stamp carried by a rigid glass carrier. By means of a vacuum between the stamp and the glass carrier, the patterned stamp can be progressively brought into contact with a photo resist layer. After curing of the photo resist layer by impinging light onto it through the transparent stamp, the stamp can be progressively released from the substrate leaving well-defined structures with dimensions of smaller than 100 nm.

In Mingato Li, et al., Fabrication of circular optical structures with a 20 nm minimum size using nano-imprint lithography, Applied physics letters, volume 76, number 6 page 673-675, it is described that a parallel plate imprint machine can be used to manufacture Fresnel Zone plates.

WO 2009/078881 describes an imprint lithography stamp having a regular pattern of sub-features, the stamp being made of silicon or polymeric materials.

In an embodiment of a security device according to the invention, the array of lenses is an array of elongated cylindrical lenses, the image pattern being comprised of groups of parallel image lines. In this manner, the elongated lenses may interfere with the underlying image pattern when the lenses are placed at an angle with the underlying image lines to generate a Moiré pattern of shifting dark and light bands that shift across the image are when the security device is tilted relative to the viewer. This technology is described in EP 1 894 169 in the name of the applicant.

BRIEF DESCRIPTION OF THE DRAWINGS

Embodiments of a security device and method of manufacturing will by way of non-limiting example, be explained in detail with reference to the accompanying drawings. In the drawings.

DETAILED DESCRIPTION OF THE INVENTION

Figure 1A:
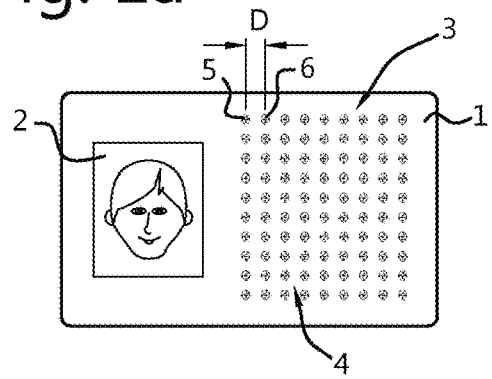
FIG. 1a and FIG. 1b respectively show a top plan view and a cross-sectional view of a security card having an image pattern prior to forming of the lenses, FIG. 2a and FIG. 2b respectively show a top plan view and a cross-sectional view of the security card of FIGS. 1a and 1b after forming of the lenses within a contour.

FIG. 1a shows a security card 1 such as a bank card, credit card, identification pass, driver's license and the like, having a portrait photograph 2 and in an image area 3 a pattern 4 of image elements 5,6. The image elements 5, 6 can comprise small geometrical shapes such as lines, dots, polygonal figures, small portrait images corresponding to primary portrait photograph 2, such as described in PCT/NL2014/050846 and the like, the pattern 4 having a uniform appearance when viewed by a user. The optical structures 5, 6 are spaced at a mutual distance D.

Figure 1B:
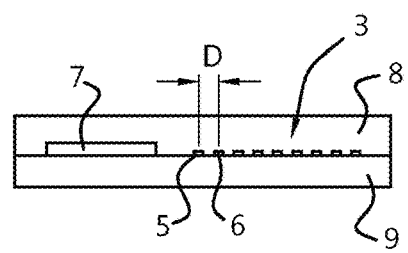

As shown in FIG. 1b, the security card 1 comprises one or more base layers 9 which may be formed of PVC, PE, Polycarbonate and the like or any combinations thereof. The primary portrait image 2 is formed by a layer of ink 7 that has been screen printed or printed by ink jet onto the base layer 9. Alternatively, the portrait 2 may be formed by laser engraving into the base layer 9 which may be formed of Polycarbonate provided with laser sensitive material to cause selective blackening. The image elements 5, 6 may be printed onto the base layer 9 or may be provided by laser engraving, or combinations thereof in the image area 3. Covering at least the image area 3 is a plastics top layer 8. In FIG. 1b the top layer 8 also extends over the ink layer 7 to form a protective surface of uniform height.

Figure 2A:
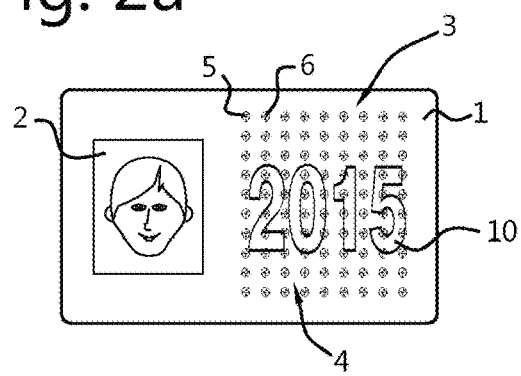

FIG. 2a shows the security card 1 wherein in the top layer 8 an array of lenses 11,12 (see FIG. 2b) has been formed within an image contour 10, which in this example represents the priority year of the present application. The image contour 10 may represent data pertaining to the issuing authority of the security card 1, such as expiration date or issue date, but can also relate to the holder of the card 1 of which portrait 2 is present, such as age, or biometric data such as color of eyes or length.

Figure 2B:
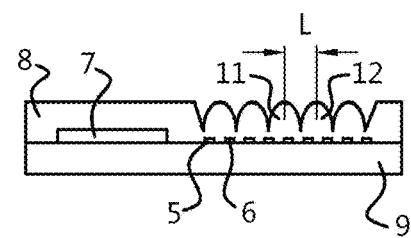

As can be seen in FIG. 2b, the lenses 11,12 are of spherical shape and form a regular array with a distance L between the lenses. The distance L can be larger by for instance 1% than the distance D and as a result the viewer observes the image elements 5,6 underlying the lenses 11,12 in a Moiré magnified manner as floating below the base layer 9. When the distance L between the lenses is larger by for instance 1% than the distance D between the image elements, then the viewer observes a Moiré magnified image of the image elements 5,6 floating above the top layer 8. the observed image can correspond to enlarged versions of the individual image elements 5,6 or can form a composed image in which multiple image elements are combined to show an enlarged object, for instance a single enlarged portrait 2 (which can serve as an authentication image for the primary image 2) or a three-dimensional object. This magnified view is visible only within the contour in which the lenses 11,12 have been formed, which contour in itself can provide information. The contour 10 can be composed of Alfa-numerical characters giving an indication of the date of birth of the user, the issue or expiry date of the security card 1, and the like. Alternatively, the contour 10 can have any desired shape suitable of being applied on a security card, and conveying to the user meaningful authentication information.

Figure 3A:
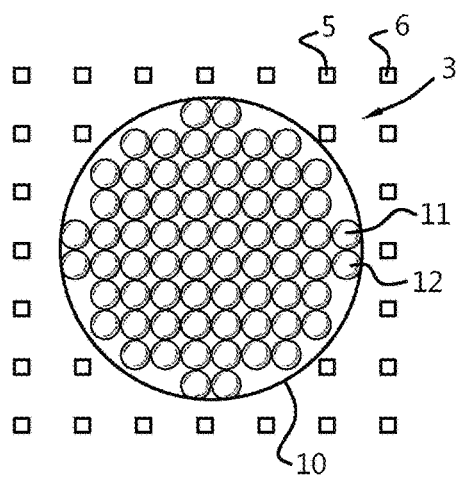
FIGS. 3a-3c show a lens pattern within a circular contour, a two-dimensional enlarged image of the image elements and a perspective view of a three-dimensional composed image, respectively, FIGS. 4a and 4b respectively shown a line pattern and with a contour an interfering elongated lens pattern.
Figure 3B:
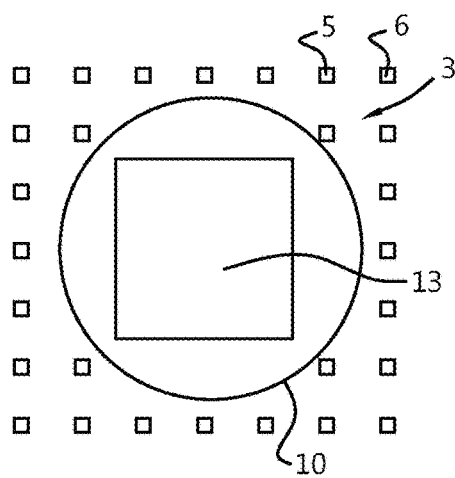

FIG. 3a shows an example of the position of the lenses 11,12 within a circular contour 10, without the optical effect of the lenses having been illustrated. In FIG. 3b, the image 13 that is observed by the user in the plane of the drawing is shown, in this example a square. This image 13 may be an enlarged version of the image elements 5,6, which in this case are formed by small-sized squares that appear to the naked eye as a more or less uniform pattern in the image are 3 outside the contour 10. The circular contour 10 forms a visual authentication feature relating to the issuing authority of the security document, but can be of more complex shape. It is also possible to vary the contour 10 for each individual security card or document or set of security cards or documents, while leaving the pattern of image elements 5,6 unaltered.

Figure 3C:
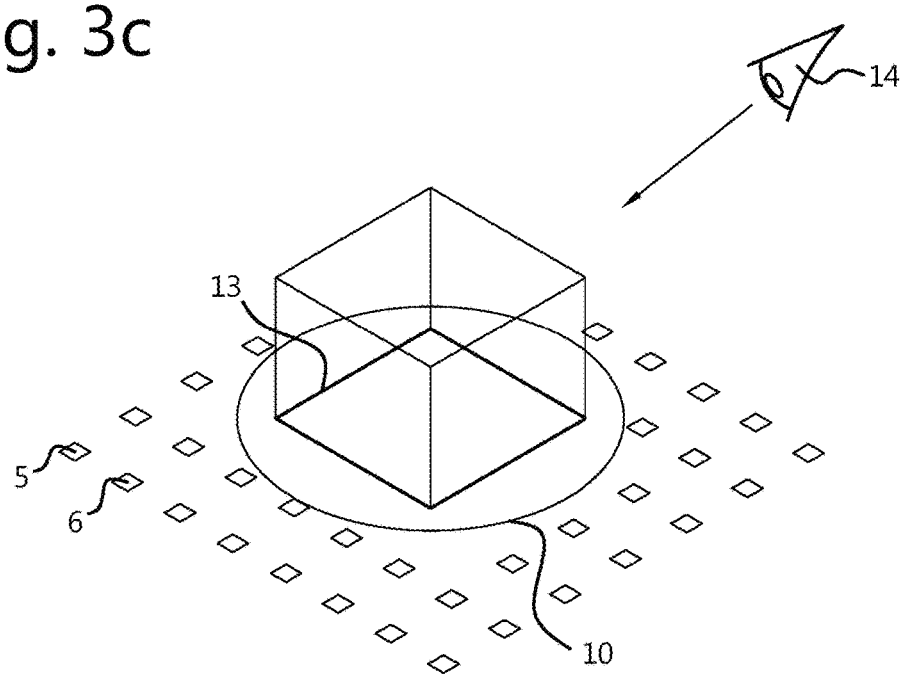

Alternatively, as illustrated in the perspective view according to FIG. 3c, the observer 14 may view the image 13 for instance as a three-dimensional wire cube, in which case the image elements 5,6 are formed by different two-dimensional structures that, when combined in a magnified manner by the lenses 11,12 within the contour 10, visually constitute the three-dimensional image 13.

Figure 4A:
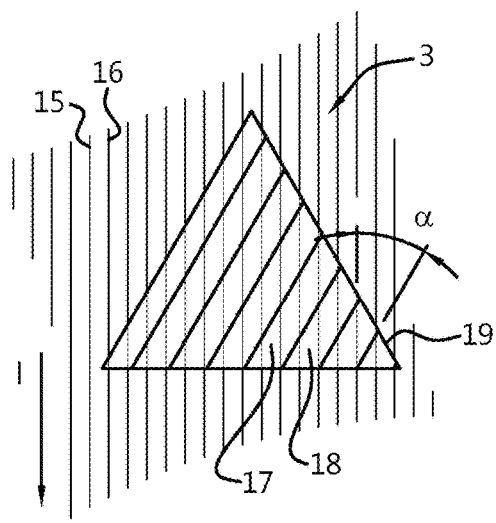
Figure 4B:
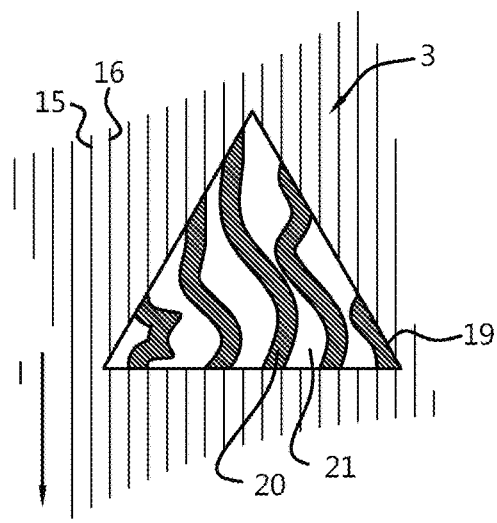

FIG. 4a shows an embodiment in which the images 5,6 are formed by printed or laser-engraved lines 15, 16 extending in a length direction 1. The lenses 17,18 are situated within a triangular contour 19 and include a small angle α, for instance 1-3 degrees, with the lines 15,16. The lenses 12 are line-shaped cylindrical lenses. Within the contour 19, as shown in FIG. 4b, the user observes a Moiré pattern of light and dark bands 20, 21 which move within the contour 19 when the plane the security card 1 is tilted relative to the observer.

Figure 5:
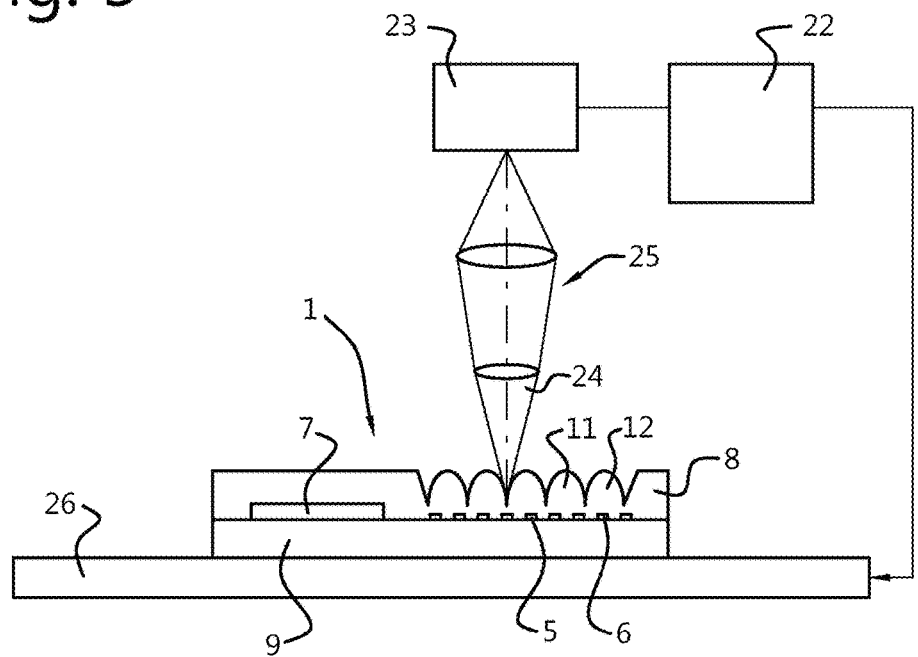
FIG. 5 shows a schematic view of a method of providing the lenses by laser ablation.

FIG. 5. shows a method of forming a security card 1 by laser ablation of the top layer 8 for forming lenses 11,12. A laser beam generator 23 scans a laser beam, focused by optical system 25, across the top layer 8, controlled by a controller 22. In the controller 22, a memory is provided in which information is stored about the contour within which the lenses are to be formed. For instance, the controller 22 may receive and store Alfa-numerical information about the holder of the security document such as date of birth, name, address or other characteristics, and provide the lens pattern within a contour that represents this Alfa-numerical information. This system allows providing a nearly completed security card including the image 7 and protective top layer 8 at one location and to transport this card to a site of issue at which the card is activated and/or authenticated by an authorized entity in a final activation/authentication step in which the lenses 11,12 are applied, for instance at a town hall or post office.

The controller 22 may be connected to a support table 26 onto which the card 1 is placed. The support table 26 can be translated in an x-y direction and/or can be tilted along an axis perpendicular to the plane of the drawing.

Figure 6:
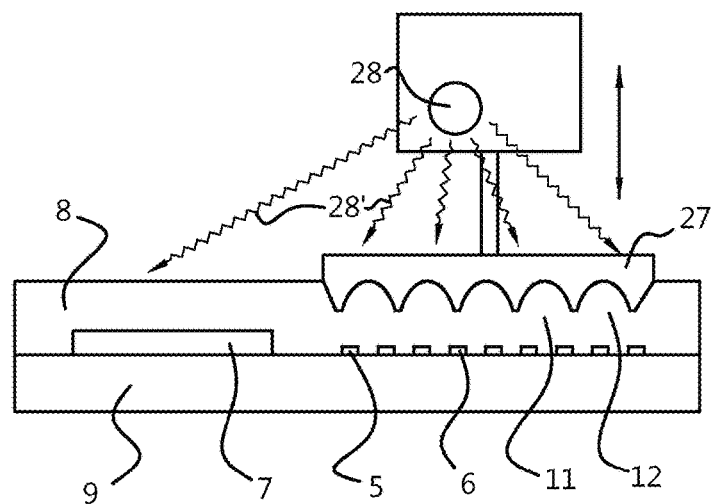
FIG. 6 shows a schematic view of a method of providing the lenses by imprinting.

In FIG. 6 an embodiment is shown in which the lenses 11,12 are formed in the top layer 8 by an imprinting member 27. The layer 8 in this case comprises an UV curable transparent resin, that is applied across base layer 9 such as to cover the image 7 and the image elements 5,6. Next, a UV-transparent silicone imprinting member 27 that forms a mold for the lens pattern within a specific contour, is pressed into the liquid resin of top layer 8 which is thereafter cured via a UV source 28, 28' irradiating the top layer 8 through the UV-transparent imprinting member 27. After hardening of the resin, the imprinting member 27 is lifted from the top layer 8, in the manner that has been described in Dutch patent application number 2014520, filed by the applicant on Mar. 25, 2015.

GLOSSARY

1 Security card
2 photograph
3 image area
4 image pattern
5 mage element
6 mage element
7 ink layer
8 top layer
9 base layer
10 contour
11 lens
12 lens
13 image
14 observer
15 line
16 line
17 lens
18 lens
19 contour
20 band
21 band
22 controller
23 laser beam generator
24 laser beam
25 optical system
26 support table
27 imprinting member
28 UV light source

The invention claimed is:

1. A security document (1), comprising:
a portrait image (2) of a holder; and
an image area (3),
the image area having therein
an image pattern of mutually spaced image elements (5,6) at a mutual first distance D,
a layer (8) of plastic material overlying the image area, and
an array of lenses (11,12;17,18) in said plastic material layer (8),
wherein the lenses (11,12) are spaced at a mutual second distance L which differs from the first distance D,
wherein the array of lenses overlies only a part of the image pattern (4), and is formed in the plastic material layer (8) within an image contour (10,19) in such a way that a part of the image pattern below the plastic material layer (8)
is situated outside the image contour,
is not covered by any lenses, and
has a uniform appearance when viewed by a user,
and wherein said image contour forms holder-specific indicia that displays information pertaining to the holder and/or an issuing authority of the document (1).

2. The security document (1) according to claim 1, wherein the lenses (11, 12;17,18) are formed by laser ablation of the plastic material layer (8).

3. The security document (1) according to claim 1, wherein the lenses (11,12;17,18) are formed by imprinting.

4. The security document (1) according to claim 1, wherein the image elements (4,6) are formed by an array of microstructures.

5. The security document (1) according to claim 1, wherein the array of lenses is an array of elongated cylindrical lenses (17,18), and the image elements comprise parallel image lines (15,16) having a length direction (1) extending at an angle (a) to the elongated cylindrical lenses (17,18).

6. The security document (1) according to claim 1, wherein the image elements (5,6) are written into either of the plastic material layer or a layer below the plastic material layer, by means of a laser.

7. The security document (1) according to claim 1, in which the image elements (5,6) are printed.

8. The security document (1) according to claim 2, wherein the image elements (4,6) are formed by an array of microstructures.

9. The security document (1) according to claim 3, wherein the image elements (4,6) are formed by an array of microstructures.

10. The security document (1) according to claim 2, wherein the array of lenses is an array of elongated cylindrical lenses (17,18), and the image elements comprise parallel image lines (15,16) having a length direction (1) extending at an angle (a) to the elongated cylindrical lenses (17,18).

11. The security document (1) according to claim 3, wherein the array of lenses is an array of elongated cylindrical lenses (17,18), and the image elements comprise parallel image lines (15,16) having a length direction (1) extending at an angle (a) to the elongated cylindrical lenses (17,18).

12. The security document (1) according to claim 4, wherein the array of lenses is an array of elongated cylindrical lenses (17,18), and the image elements comprise parallel image lines (15,16) having a length direction (1) extending at an angle ($\alpha$) to the elongated cylindrical lenses (17,18).

13. The security document (1) according to claim 2, wherein the image elements (5,6) are written into either of the plastic material layer or a layer below the plastic material layer, by means of a laser.

14. The security document (1) according to claim 3, wherein the image elements (5,6) are written into either of the plastic material layer or a layer below the plastic material layer, by means of a laser.

15. A security document (1), comprising:
a portrait image (2) of a holder: and
an image area (3),
the image area having therein
an image pattern of mutually spaced image elements (5,6) at a mutual first distance D,
a layer (8) of plastic material overlying the image area, and an array of lenses (11,12;17,18) in the plastic material layer (8),
wherein the array of lenses overlies only a part of the image pattern (4), and is formed in the plastic material layer (8) within an image contour (10,19) by laser ablation of the plastic material layer in such a way that a part of the image pattern below the plastic material layer (8)
is situated outside the image contour,
is not covered by any lenses, and
has a uniform appearance when viewed by a user,
and wherein said image contour forms holder-specific indicia that displays information pertaining to the holder and/or an issuing authority of the document.

16. A method of forming a security document (1), comprising the steps of:
providing a first layer (9) comprising an image area (3), the image area having an image pattern therein, and a second layer (8) of a plastic material overlying the image area (3);
providing a portrait image of a holder in or on said first layer (9);
forming an array of lenses (11,12;17,18) in the second layer within an image contour, wherein said array of lenses overlies only a first part of the image pattern such that a second part of the image pattern below the second layer (8) and outside the image contour is not covered by any lenses and has a uniform appearance when viewed by a user, and said image contour forms holder-specific indicia that displays information pertaining to the holder and/or an issuing authority of the document.

17. The method according to claim 16, wherein the array of lenses (11,12;17,18) is formed by laser ablation of the second layer (8).

18. The method according to claim 16 wherein the array of lenses(11,12;17,18) is formed by imprinting of the second layer (8).

19. The method according to claim 16, wherein the image pattern comprises a matrix of images spaced at a first mutual distance D, and the array of lenses (11,12;17,18) is comprised of lens elements that are spaced apart from each other at a second mutual distance L which differs from the first mutual distance D.

20. The method according to claim 16, wherein the image pattern is comprised of groups of image lines (15,16), the array of lenses comprising elongate cylindrical lenses (17, 18) that are formed at an angle (a) to the image lines (15,16).

* * * * *